(12) United States Patent
Steuer et al.

(10) Patent No.: US 10,557,875 B2
(45) Date of Patent: Feb. 11, 2020

(54) MULTI-SENSOR SCANNER CONFIGURATION FOR NON-CONTACT VOLTAGE MEASUREMENT DEVICES

(71) Applicant: Fluke Corporation, Everett, WA (US)

(72) Inventors: Ronald Steuer, Hinterbruhl (AT); Ricardo Rodriguez, Mill Creek, WA (US)

(73) Assignee: Fluke Corporation, Everett, WA (US)

( * ) Notice: Subject to any disclaimer, the term of this patent is extended or adjusted under 35 U.S.C. 154(b) by 84 days.

(21) Appl. No.: 15/974,994

(22) Filed: May 9, 2018

(65) Prior Publication Data

US 2019/0346494 A1    Nov. 14, 2019

(51) Int. Cl.
*G01R 19/25* (2006.01)
*G01R 19/155* (2006.01)

(52) U.S. Cl.
CPC ....... *G01R 19/2506* (2013.01); *G01R 19/155* (2013.01)

(58) Field of Classification Search
CPC .............. G01R 19/2506; G01R 19/155; G01R 31/2601; G01R 31/3183; G01R 31/319;
(Continued)

(56) References Cited

U.S. PATENT DOCUMENTS 5,473,244 A    12/1995 Libove et al.
5,583,444 A    12/1996 Nakamura et al.
(Continued)

FOREIGN PATENT DOCUMENTS

CN    2639905 Y    9/2004
EP    1 249 706 B1    9/2007
(Continued)

OTHER PUBLICATIONS

Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.
(Continued)

*Primary Examiner* — Dominic E Hawkins
(74) *Attorney, Agent, or Firm* — Seed Intellectual Property Law Group LLP

(57) ABSTRACT

Systems and methods for measuring AC voltage of an insulated conductor are provided, without requiring a galvanic connection between the conductor and a test electrode. A non-galvanic contact voltage measurement system includes a sensor subsystem, an internal ground guard and a reference shield. A common mode reference voltage source is electrically coupled between the internal ground guard and the reference shield to generate an AC reference voltage which causes a reference current to pass through the conductive sensor. Control circuitry receives a signal indicative of current flowing through the sensor subsystem due to the AC reference voltage and the AC voltage in the insulated conductor, and determines the AC voltage in the insulated conductor based at least in part on the received signal. The sensor subsystem includes a plurality of sensors that are polled to compensate for conductor position while allowing for measurement of physical characteristics of the conductor.

25 Claims, 6 Drawing Sheets

(58) Field of Classification Search
CPC .............. G01R 31/2612; G01R 31/261; G01R 31/2623
See application file for complete search history.

(56) References Cited

U.S. PATENT DOCUMENTS

| | | | |
|---|---|---|---|
| 5,973,501 A | 10/1999 | Reichard | |
| 6,014,027 A | 1/2000 | Reichard | |
| 6,043,640 A | 3/2000 | Lauby et al. | |
| 6,118,270 A | 9/2000 | Singer et al. | |
| 6,644,636 B1 | 11/2003 | Ryan | |
| 6,664,708 B2 | 12/2003 | Schlimak et al. | |
| 6,812,685 B2 | 11/2004 | Steber et al. | |
| 6,825,649 B2 | 11/2004 | Nakano | |
| 7,084,643 B2 | 8/2006 | Howard et al. | |
| 7,466,145 B2 | 12/2008 | Yanagisawa | |
| 8,054,061 B2 | 11/2011 | Prance et al. | |
| 8,222,886 B2 | 7/2012 | Yanagisawa | |
| 8,680,845 B2 | 3/2014 | Carpenter et al. | |
| 8,803,506 B2 | 8/2014 | Yanagisawa | |
| 9,063,184 B2 | 6/2015 | Carpenter et al. | |
| 9,201,100 B2 | 12/2015 | Yanagisawa | |
| 9,651,584 B2 * | 5/2017 | Gunn | G01R 35/005 |
| 2002/0167303 A1 | 11/2002 | Nakano | |
| 2007/0086130 A1 * | 4/2007 | Sorensen | G01R 15/16 361/62 |
| 2009/0058398 A1 | 3/2009 | Ibuki | |
| 2010/0060300 A1 | 3/2010 | Müller et al. | |
| 2010/0090682 A1 | 4/2010 | Armstrong | |
| 2010/0283539 A1 | 11/2010 | Yanagisawa | |
| 2012/0200291 A1 | 8/2012 | Carpenter et al. | |
| 2012/0259565 A1 * | 10/2012 | Oshima | G01R 21/06 702/61 |
| 2012/0290240 A1 | 11/2012 | Fukui | |
| 2013/0076343 A1 * | 3/2013 | Carpenter | G01R 33/02 324/202 |
| 2013/0124136 A1 | 5/2013 | Neeley et al. | |
| 2013/0147464 A1 * | 6/2013 | Tan | G01R 1/22 324/126 |
| 2014/0035607 A1 | 2/2014 | Heydron et al. | |
| 2014/0062459 A1 | 3/2014 | El-Essawy et al. | |
| 2015/0042320 A1 | 2/2015 | Cadugan et al. | |
| 2016/0047846 A1 * | 2/2016 | Sharma | G01R 15/207 324/251 |
| 2016/0080667 A1 | 3/2016 | Stuart et al. | |
| 2016/0109486 A1 | 4/2016 | Yanagisawa | |
| 2016/0119592 A1 | 4/2016 | Stuart et al. | |
| 2016/0187389 A1 * | 6/2016 | Kshirsagar | G01R 19/0053 324/76.11 |
| 2018/0136264 A1 * | 5/2018 | Steuer | G01R 19/257 |

FOREIGN PATENT DOCUMENTS

| | | |
|---|---|---|
| JP | 9-184866 A | 7/1997 |
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2016-3997 A | 1/2016 |

OTHER PUBLICATIONS

Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.

Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.

Galliana et al., "Traceable Technique to Calibrate Clamp Meters in AC Current From 100 to 1500 A," *IEEE Transactions on Instrumentation and Measurement* 61(9):2512-2518, 2012.

Hioki, "3258 : Safety HiTester," Revised Edition 5, Hioki E. E. Corporation, Nagano Japan, 2 pages.

Huber et al., "Non-Contact Voltage Measurement Systems," U.S. Appl. No. 62/421,124, filed Nov. 11, 2016, 122 pages.

Mitchell Instrument Company Inc., clipping from the Mitchell Catalogue, undated, 1 page.

Neeley et al., "Maintenance Management Systems and Methods," U.S. Appl. No. 61/514,842, filed Aug. 3, 2011, 22 pages.

Ringsrud et al., "Non-Contact Voltage Measurement System," U.S. Appl. No. 15/345,256, filed Nov. 7, 2016, 39 pages.

Rodriguez et al., "Non-Contact Current Measurement System," U.S. Appl. No. 15/604,320, filed May 24, 2017, 66 pages.

Steuer et al., "Non-Contact Electrical Parameter Measurement Systems," U.S. Appl. No. 15/625,745, filed Jun. 16, 2017, 130 pages.

Steuer et al., "Non-Contact Voltage Measurement System Using Multiple Capacitors," U.S. Appl. No. 15/412,891, filed Jan. 23, 2017, 35 pages.

Steuer et al., "Non-Contact Voltage Measurement System Using Reference Signal," U.S. Appl. No. 15/413,025, filed Jan. 23, 2017, 49 pages.

Stuart et al., "Combined Use of Digital Multimeter and Infrared Camera to Analyze and Diagnose Issues With Voltage Drop and Impedance," U.S. Appl. No. 62/051,930, filed Sep. 17, 2014, 3 pages.

Stuart et al., "Imaging System Employing Fixed, Modular Mobile, and Portable Infrared Cameras With Ability to Receive, Communicate, and Display Data and Images With Proximity Detection," U.S. Appl. No. 62/068,392, filed Oct. 24, 2014, 9 pages.

Stuart et al., "Infrared Cameras Used As a Method to Trigger Operation and/or Recording of Test and Measurement Devices," U.S. Appl. No. 62/076,088, filed Nov. 6, 2014, 14 pages.

Takahashi, "Clamp on Power Logger PW3365 : Safety Voltage Sensor PW9020," *Hioki Technical Notes* 1(1): 2015, 8 pages.

Tsang et al., "Dual capacitive sensors for non-contact AC voltage measurement," *Sensors and Actuators A* 167:261-266, 2011.

* cited by examiner

MULTI-SENSOR SCANNER CONFIGURATION FOR NON-CONTACT VOLTAGE MEASUREMENT DEVICES

BACKGROUND

Technical Field

The present disclosure generally relates to voltage measurement devices, and more particularly, to sensors for voltage measurement devices.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least two measurement electrodes or probes into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution. A "non-contact" voltage measurement device may be used to detect the presence of alternating current (AC) voltage without requiring galvanic contact with the circuit. When a voltage is detected, the user is alerted by an indication, such as a light, buzzer, or vibrating motor. However, such non-contact voltage detectors provide only an indication of the presence or absence of an AC voltage, and do not provide an indication of the actual magnitude (e.g., RMS value) of the AC voltage.

Thus, there is a need for an AC voltage measurement system which provides convenient and accurate voltage measurements without requiring galvanic contact with the circuit being tested.

BRIEF SUMMARY

A device to measure alternating current (AC) in an insulated conductor may be summarized as including: a housing; a sensor subsystem physically coupled to the housing, the sensor subsystem selectively positionable proximate the insulated conductor without galvanically contacting the conductor, wherein the sensor subsystem capacitively couples with the insulated conductor, the sensor subsystem including a plurality of sensor elements; a conductive internal ground guard which at least partially surrounds the sensor subsystem and is galvanically isolated from the sensor subsystem, the internal ground guard sized and dimensioned to shield the sensor subsystem from stray currents; a conductive reference shield which surrounds at least a portion of the housing and is galvanically insulated from the internal ground guard, the conductive reference shield sized and dimensioned to reduce currents between the internal ground guard and an external ground; a common mode reference voltage source which, in operation, generates an alternating current (AC) reference voltage having a reference frequency, the common mode reference voltage source electrically coupled between the internal ground guard and the conductive reference shield; signal conditioning circuitry that, in operation, generates a sensor current signal indicative of current conducted through the sensor subsystem; a plurality of controllable switches, each of the plurality of switches being operative to selectively electrically couple a respective one of the sensor elements to the signal conditioning circuitry; and control circuitry communicatively coupled to the plurality of switches and the signal conditioning circuitry, wherein, in operation, the control circuitry: controls the plurality of controllable switches to cause one of the sensor elements to be electrically coupled to the signal conditioning circuitry; receives a sensor current signal from the signal conditioning circuitry; and determines the AC voltage in the insulated conductor based at least in part on the received sensor current signal, the AC reference voltage, and the reference frequency.

Each of the plurality of controllable switches may be controllable into a first state and a second state, wherein in the first state, the switch may electrically couple a respective one of the sensor elements to the signal conditioning circuitry, and in the second state, the switch may electrically couple a respective one of the sensor elements to the internal ground guard. The control circuitry: for each of the plurality of sensor elements: may control the controllable switch that is electrically coupled to the sensor element to couple the sensor element to the signal conditioning circuitry; may control the remaining controllable switches to electrically decouple the remaining sensor elements from the signal conditioning circuitry; and may receive a sensor current signal for the sensor element from the signal conditioning circuitry; and may determine which one of the plurality of sensor elements generates a sensor current signal that has the largest magnitude, wherein to control the plurality of controllable switches to cause one of the sensor elements to be electrically coupled to the signal conditioning circuitry, the control circuitry may control the plurality of controllable switches to cause the sensor element determined to generate a sensor current signal that has the largest magnitude to be electrically coupled to the signal conditioning circuitry. The control circuitry: for each of the plurality of sensor elements: may control the controllable switch that is electrically coupled to the sensor element to couple the sensor element to the signal conditioning circuitry; may control the remaining controllable switches to electrically decouple the remaining sensor elements from the signal conditioning circuitry; and may receive a sensor current signal for the sensor element from the signal conditioning circuitry; and may determine a physical characteristic of the conductor under test based at least in part on the received sensor current signals for each of the sensor elements. The physical characteristic may include at least one of: a physical dimension of the conductor under test, or a physical position of the conductor under test. The control circuitry may determine a physical characteristic of the conductor under test via analysis of a distribution of the received sensor current signals for each of the sensor elements. The signal conditioning circuitry may include at least one of an amplifier, a filter, or an analog-to-digital converter. The sensor subsystem and the internal ground guard may each be non-planar in shape. The control circuitry: may convert the received sensor current signal to a digital signal; and may process the digital signal to obtain a frequency domain representation of the sensor current signal. The control circuitry may implement a fast Fourier transform (FFT) to obtain the frequency domain representation of the sensor current signal. The common mode reference voltage source may generate the AC reference voltage in phase with a window of the FFT implemented by the control circuitry. The control circuitry may process the sensor current signal to determine an insulated conductor current component and a reference current component, the insulated conductor current component indicative of the current conducted through the sensor element due to the voltage in the insulated conductor, and the reference current component indicative of the current conducted through the sensor element due to the voltage of the common mode reference voltage source. The control circuitry may determine the frequency of the determined insulated conductor current component of the sensor current signal. The control circuitry may determine the AC voltage in the insulated conductor based on the insulated conductor current component, the reference current component, the frequency of the insulated conductor current component, the reference frequency and the AC reference voltage.

A method of operating a device to measure alternating current (AC) voltage in an insulated conductor may be summarized as including a housing, a sensor subsystem physically coupled to the housing, the sensor subsystem selectively positionable proximate the insulated conductor without galvanically contacting the conductor, wherein the sensor subsystem capacitively couples with the insulated conductor, the sensor subsystem including a plurality of sensor elements, a conductive internal ground guard which at least partially surrounds the sensor subsystem and is galvanically isolated from the sensor subsystem, the internal ground guard sized and dimensioned to shield the sensor subsystem from stray currents, and a conductive reference shield which surrounds at least a portion of the housing and is galvanically insulated from the internal ground guard, the conductive reference shield sized and dimensioned to reduce currents between the internal ground guard and an external ground, the method further including: causing a common mode reference voltage source to generate an alternating current (AC) reference voltage having a reference frequency, the common mode reference voltage source electrically coupled between the internal ground guard and the conductive reference shield; controlling a plurality of controllable switches to cause one of the sensor elements to be electrically coupled to signal conditioning circuitry; receiving a sensor current signal from the signal conditioning circuitry; and determining the AC voltage in the insulated conductor based at least in part on the received sensor current signal, the AC reference voltage, and the reference frequency.

The method may further include: for each of the plurality of sensor elements: controlling the controllable switch that is electrically coupled to the sensor element to couple the sensor element to the signal conditioning circuitry; controlling the remaining controllable switches to electrically decouple the remaining sensor elements from the signal conditioning circuitry; and receiving a sensor current signal for the sensor element from the signal conditioning circuitry; and determining which one of the plurality of sensor elements generates a sensor current signal that has the largest magnitude, wherein controlling the plurality of controllable switches to cause one of the sensor elements to be electrically coupled to the signal conditioning circuitry may include controlling the plurality of controllable switches to cause the sensor element determined to generate a sensor current signal that has the largest magnitude to be electrically coupled to the signal conditioning circuitry. The method may further include: for each of the plurality of sensor elements: controlling the controllable switch that is electrically coupled to the sensor element to couple the sensor element to the signal conditioning circuitry; controlling the remaining controllable switches to electrically decouple the remaining sensor elements from the signal conditioning circuitry; and receiving a sensor current signal for the sensor element from the signal conditioning circuitry; and determining a physical characteristic of the conductor under test based at least in part on the received sensor current signals for each of the sensor elements. Determining a physical characteristic may include determining at least one of: a physical dimension of the insulated conductor, or a physical position of the insulated conductor. Determining a physical characteristic of the insulated conductor may include analyzing a distribution of the received sensor current signals for each of the sensor elements.

A device to measure alternating current (AC) in an insulated conductor may be summarized as including: a sensor subsystem selectively positionable proximate the insulated conductor without galvanically contacting the conductor, wherein the sensor subsystem capacitively couples with the insulated conductor, the sensor subsystem including a plurality of sensor elements; signal conditioning circuitry that, in operation, generates a sensor current signal indicative of current conducted through the sensor subsystem; and a plurality of controllable switches, each of the plurality of switches being operative to selectively electrically couple a respective one of the sensor elements to the signal conditioning circuitry.

The device may further include: control circuitry communicatively coupled to the signal conditioning circuitry and the controllable switches, wherein, in operation, the control circuitry: may control the plurality of controllable switches to cause one of the sensor elements to be electrically coupled to the signal conditioning circuitry; may receive a sensor current signal from the signal conditioning circuitry; and may determine an AC voltage in the insulated conductor based at least in part on the received sensor current signal. Each of the plurality of controllable switches may be controllable into a first state and a second state, wherein in the first state, the switch may electrically couple a respective one of the sensor elements to the signal conditioning circuitry, and in the second state, the switch may electrically couple a respective one of the sensor elements to the internal ground guard.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
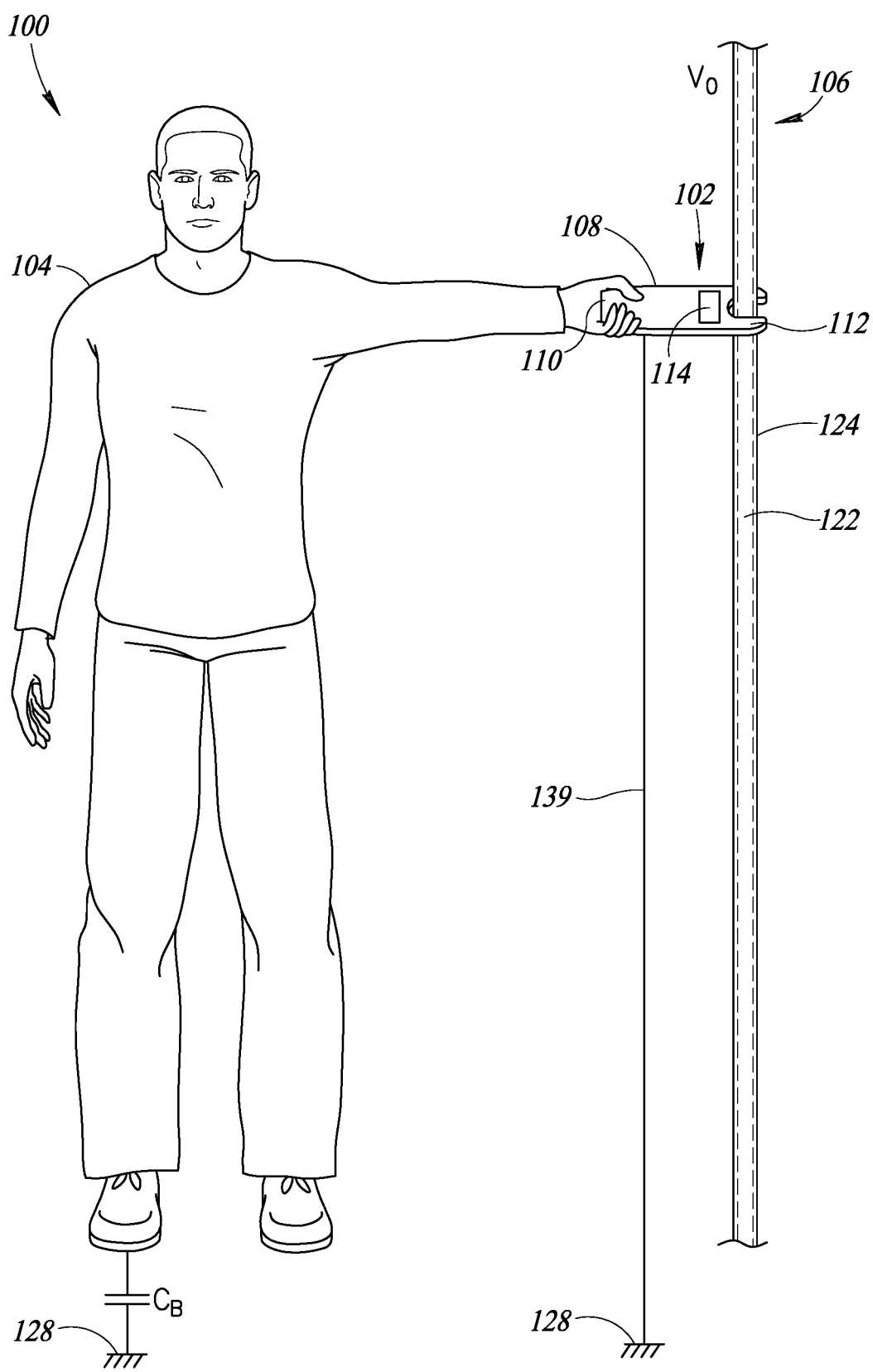
FIG. 1A is a pictorial diagram of an environment in which a non-contact voltage measurement device including a reference signal type voltage sensor may be used by an operator to measure AC voltage present in an insulated wire without requiring galvanic contact with the wire, according to one illustrated implementation.

One or more implementations of the present disclosure are directed to systems and methods for measuring alternating current (AC) voltage of an insulated or blank uninsulated conductor (e.g., insulated wire) without requiring a galvanic connection between the conductor and a test electrode or probe. Generally, a non-galvanic contact (or "non-contact") voltage measurement system is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise. As discussed further below with reference to FIGS. 5-7, in at least some implementations, a sensor subsystem may include a plurality of sensors that are polled or scanned to provide improved measurement with compensation for the position of the conductor under test.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

The following discussion provides examples of systems and methods for measuring alternating current (AC) voltage of an insulated (e.g., insulated wire) or blank uninsulated conductor (e.g., bus bar) without requiring a galvanic connection between the conductor and a test electrode or probe. The implementations disclosed in this section may be referred to herein as "reference signal type voltage sensors" or systems. Generally, a non-galvanic contact (or "non-contact") voltage measurement device is provided which measures an AC voltage signal in an insulated conductor with respect to ground using a capacitive sensor. Such systems which do not require a galvanic connection are referred to herein as "non-contact." As used herein, "electrically coupled" includes both direct and indirect electrical coupling unless stated otherwise.

Figure 1B:
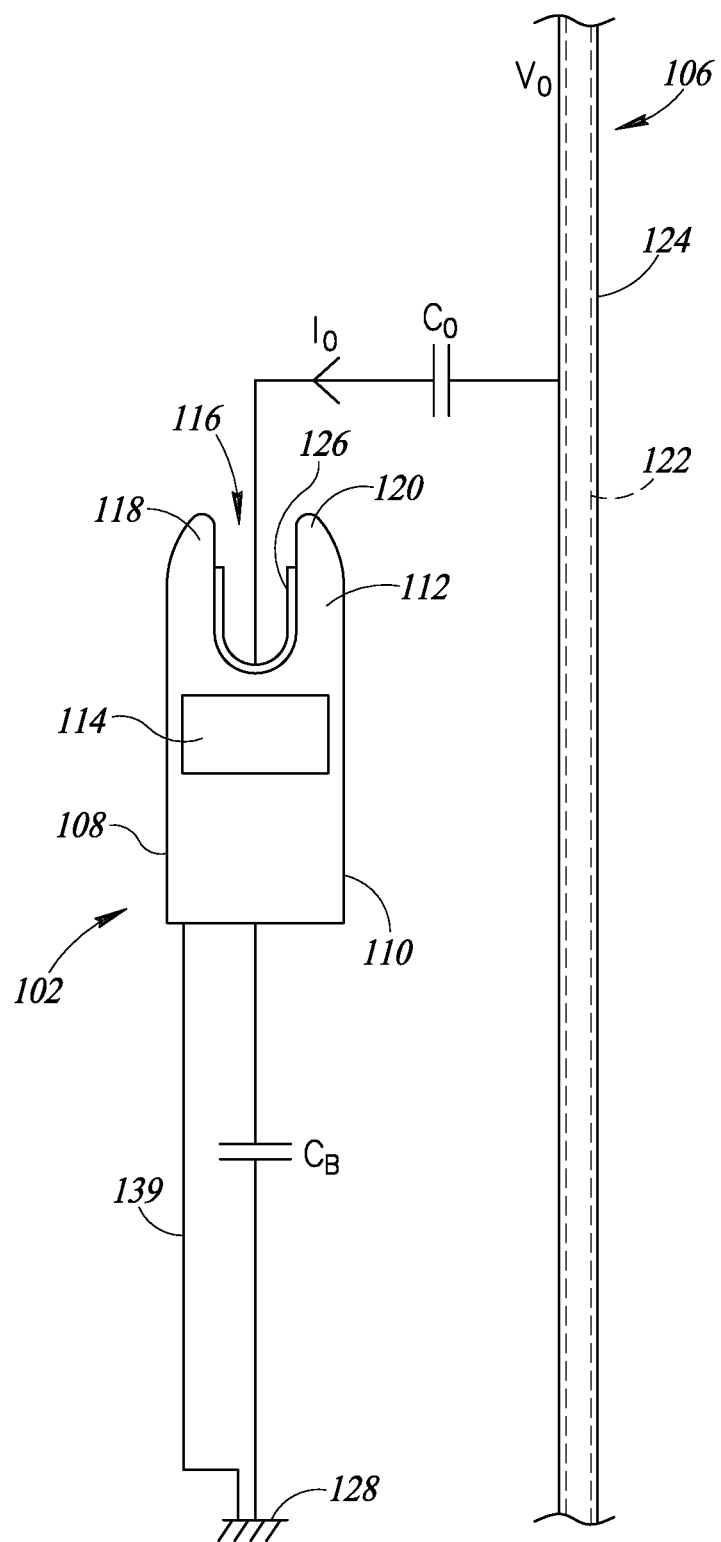
FIG. 1B is a top view of the non-contact voltage measurement device of FIG. 1A, showing a coupling capacitance formed between the insulated wire and a conductive sensor of the non-contact voltage measurement device, an insulated conductor current component, and a body capacitance between the non-contact voltage measurement device and the operator, according to one illustrated implementation.

FIG. 1A is a pictorial diagram of an environment 100 in which a non-contact voltage measurement device 102 that includes a reference signal type voltage sensor or system may be used by an operator 104 to measure AC voltage present in an insulated wire 106 without requiring galvanic contact between the non-contact voltage measurement device and the wire 106. FIG. 1B is a top plan view of the non-contact voltage measurement device 102 of FIG. 1A, showing various electrical characteristics of the non-contact voltage measurement device during operation. The non-contact voltage measurement device 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement device 102. The user interface 114 may include any number of inputs (e.g., buttons, dials, switches, touch sensor) and any number of outputs (e.g., display, LEDs, speakers, buzzers). The non-contact voltage measurement device 102 may also include one or more wired and/or wireless communications interfaces (e.g., USB, Bluetooth®).

In at least some implementations, as shown best in FIG. 1B, the probe portion 112 may include a recessed portion 116 defined by first and second extended portions 118 and 120. The recessed portion 116 receives the insulated wire 106 (see FIG. 1A). The insulated wire 106 includes a conductor 122 and an insulator 124 surrounding the conductor 122. The recessed portion 116 may include a sensor or electrode 126 which rests proximate the insulator 124 of the insulated wire 106 when the insulated wire is positioned within the recessed portion 116 of the non-contact voltage measurement device 102. Although not shown for clarity, the sensor 126 may be disposed inside of the housing 108 to prevent physical and electrical contact between the sensor and other objects.

As shown in FIG. 1A, in use the operator 104 may grasp the grip portion 110 of the housing 108 and place the probe portion 112 proximate the insulated wire 106 so that the non-contact voltage measurement device 102 may accurately measure the AC voltage present in the wire with respect to earth ground (or another reference node). Although the probe end 112 is shown as having the recessed portion 116, in other implementations the probe portion 112 may be configured differently. For example, in at least some implementations the probe portion 112 may include a selectively movable clamp, a hook, a flat or arcuate surface which includes the sensor, or other type of interface which allows a sensor of the non-contact voltage measurement device 102 to be positioned proximate the insulated wire 106. Examples of various probe portions and sensors are discussed below with reference to FIGS. 5-7.

The operator's body acting as a reference to earth/ground may only be in some implementations. Alternatively a direct connection to earth 128 via a test lead 139 can be used. The non-contact measurement functionality discussed herein is not limited to applications only measuring against earth. The outside reference may be capacitively or directly coupled to any other potential. For example, if the outside reference is capacitively coupled to another phase in three phase systems, the phase-to-phase voltages are measured. In general, the concepts discussed herein are not limited to reference against earth only using a body capacitive coupling connected to a reference voltage and any other reference potential.

As discussed further below, in at least some implementations, the non-contact voltage measurement device 102 may utilize the body capacitance ($C_B$) between the operator 104 and ground 128 during the AC voltage measurement. Although the term ground is used for the node 128, the node is not necessarily earth/ground but could be connected in a galvanically isolated manner to any other reference potential by capacitive coupling.

The particular systems and methods used by the non-contact voltage measurement device 102 to measure AC voltage are discussed below with reference to FIGS. 2-4.

Figure 2:
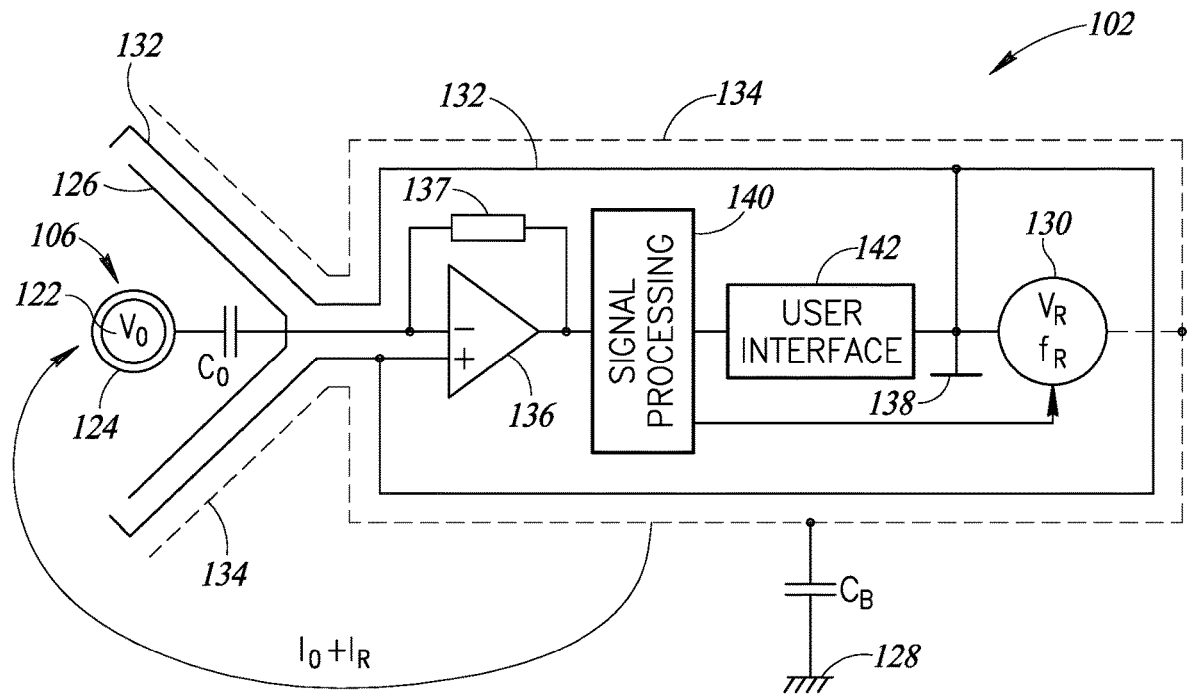
FIG. 2 is a schematic diagram of various internal components of a non-contact voltage measurement device, according to one illustrated implementation.

FIG. 2 shows a schematic diagram of various internal components of the non-contact voltage measurement device 102 also shown in FIGS. 1A and 1B. In this example, the conductive sensor 126 of the non-contact voltage measurement device 102 is substantially "V-shaped" and is positioned proximate the insulated wire 106 under test and capacitively couples with the conductor 122 of the insulated wire 106, forming a sensor coupling capacitor ($C_O$). The operator 104 handling the non-contact voltage measurement device 102 has a body capacitance ($C_B$) to ground. Also a direct conductive ground coupling by a wire (e.g., test lead 139) can be used as shown in FIGS. 1A and 1B. Thus, as shown in FIGS. 1B and 2, the AC voltage signal ($V_O$) in the wire 122 generates an insulated conductor current component or "signal current" ($I_O$) over the coupling capacitor ($C_O$) and the body capacitance ($C_B$), which are connected in series. In some implementations, the body capacitance ($C_B$) may also include a galvanically isolated test lead which generates a capacitance to ground or any other reference potential.

The AC voltage ($V_O$) in the wire 122 to be measured has a connection to an external ground 128 (e.g., neutral). The non-contact voltage measurement device 102 itself also has a capacitance to ground 128, which consists primarily of the body capacitance ($C_B$) when the operator 104 (FIG. 1) holds the non-contact voltage measurement device in his hand. Both capacitances $C_O$ and $C_B$ create a conductive loop and the voltage inside the loop generates the signal current ($I_O$). The signal current ($I_O$) is generated by the AC voltage signal ($V_O$) capacitively coupled to the conductive sensor 126 and loops back to the external ground 128 through the housing 108 of the non-contact voltage measurement device and the body capacitor ($C_B$) to ground 128. The current signal ($I_O$) is dependent on the distance between the conductive sensor 126 of the non-contact voltage measurement device 102 and the insulated wire 106 under test, the particular shape of the conductive sensor 126, and the size and voltage level ($V_O$) in the conductor 122.

To compensate for the distance variance and consequent coupling capacitor ($C_O$) variance which directly influences the signal current ($I_O$), the non-contact voltage measurement device 102 includes a common mode reference voltage source 130 which generates an AC reference voltage ($V_R$) which has a reference frequency ($f_R$) different from the signal voltage frequency ($f_O$).

To reduce or avoid stray currents, at least a portion of the non-contact voltage measurement device 102 may be surrounded by a conductive internal ground guard or screen 132 which causes most of the current to run through the conductive sensor 126 that forms the coupling capacitor ($C_O$) with the conductor 122 of the insulated wire 106. The internal ground guard 132 may be formed from any suitable conductive material (e.g., copper) and may be solid (e.g., foil) or have one or more openings (e.g., mesh).

Further, to avoid currents between the internal ground guard 132 and the external ground 128, the non-contact voltage measurement device 102 includes a conductive reference shield 134. The reference shield 134 may be formed from any suitable conductive material (e.g., copper) and may be solid (e.g. sheet metal, sputtered metal inside a plastic enclosure, flexible (e.g., foil), or have one or more openings (e.g., mesh). The common mode reference voltage source 130 is electrically coupled between the reference shield 134 and the internal ground guard 132, which creates a common mode voltage or reference signal having the reference voltage ($V_R$) and the reference frequency ($f_R$) for the non-contact voltage measurement device 102. Such AC reference voltage ($V_R$) drives an additional reference current ($I_R$) through the coupling capacitor ($C_O$) and the body capacitor ($C_B$).

The internal ground guard 132 which surrounds at least a portion of the conductive sensor 126 protects the conductive sensor against direct influence of the AC reference voltage ($V_R$) causing an unwanted offset of reference current ($I_R$) between the conductive sensor 126 and the reference shield 134. As noted above, the internal ground guard 132 is the internal electronic ground 138 for the non-contact voltage measurement device 102. In at least some implementations, the internal ground guard 132 also surrounds some or all of the electronics of the non-contact voltage measurement device 102 to avoid the AC reference voltage ($V_R$) coupling into the electronics.

As noted above, the reference shield 134 is utilized to inject a reference signal onto the input AC voltage signal ($V_O$) and, as a second function, minimizes the guard 132 to earth ground 128 capacitance. In at least some implementations, the reference shield 134 surrounds some or all of the housing 108 of the non-contact voltage measurement device 102. In such implementations, some or all of the electronics see the reference common mode signal which also generates the reference current ($I_R$) between the conductive sensor 126 and the conductor 122 in the insulated wire 106. In at least some implementations, the only gap in the reference shield 134 may be an opening for the conductive sensor 126 which allows the conductive sensor to be positioned proximate the insulated wire 106 during operation of the non-contact voltage measurement device 102.

The internal ground guard 132 and the reference shield 134 may provide a double layer screen around the housing 108 (see FIGS. 1A and 1B) of the non-contact voltage measurement device 102. The reference shield 134 may be disposed on an outside surface of the housing 108 and the internal ground guard 132 may function as an internal shield or guard. The conductive sensor 126 is shielded by the guard 132 against the reference shield 134 such that any reference current flow is generated by the coupling capacitor ($C_O$) between the conductive sensor 126 and the conductor 122 under test. The guard 132 around the sensor 126 also reduces stray influences of adjacent wires close to the sensor.

As shown in FIG. 2, the non-contact voltage measurement device 102 may include an input amplifier 136 which operates as an inverting current-to-voltage converter. The input amplifier 136 has a non-inverting terminal electrically coupled to the internal ground guard 132 which functions as the internal ground 138 of the non-contact voltage measurement device 102. An inverting terminal of the input amplifier 136 may be electrically coupled to the conductive sensor 126. Feedback circuitry 137 (e.g., feedback resistor) may also be coupled between the inverting terminal and the output terminal of the input amplifier 136 to provide feedback and appropriate gain for input signal conditioning.

The input amplifier 136 receives the signal current ($I_O$) and reference current ($I_R$) from the conductive sensor 126 and converts the received currents into a sensor current voltage signal indicative of the conductive sensor current at the output terminal of the input amplifier. The sensor current voltage signal may be an analog voltage, for example. The analog voltage may be fed to a signal processing module 140 which, as discussed further below, processes the sensor current voltage signal to determine the AC voltage ($V_O$) in the conductor 122 of the insulated wire 106. The signal processing module 140 may include any combination of digital and/or analog circuitry.

The non-contact voltage measurement device 102 may also include a user interface 142 (e.g., display) communicatively coupled to the signal processing module 140 to present the determined AC voltage ($V_O$) or to communicate by an interface to the operator 104 of the non-contact voltage measurement device.

Figure 3:
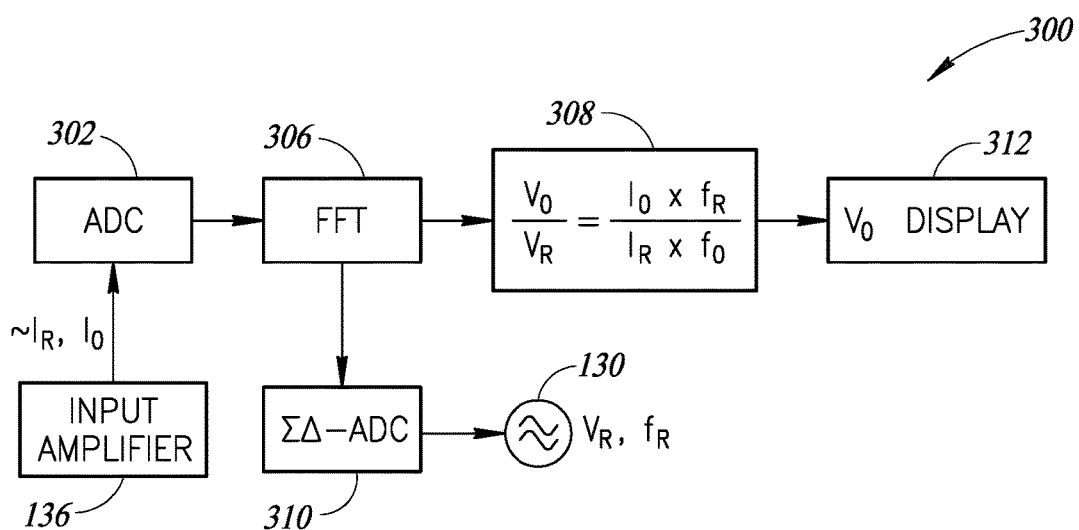
FIG. 3 is a block diagram which shows various signal processing components of a non-contact voltage measurement device, according to one illustrated implementation.
Figure 4:
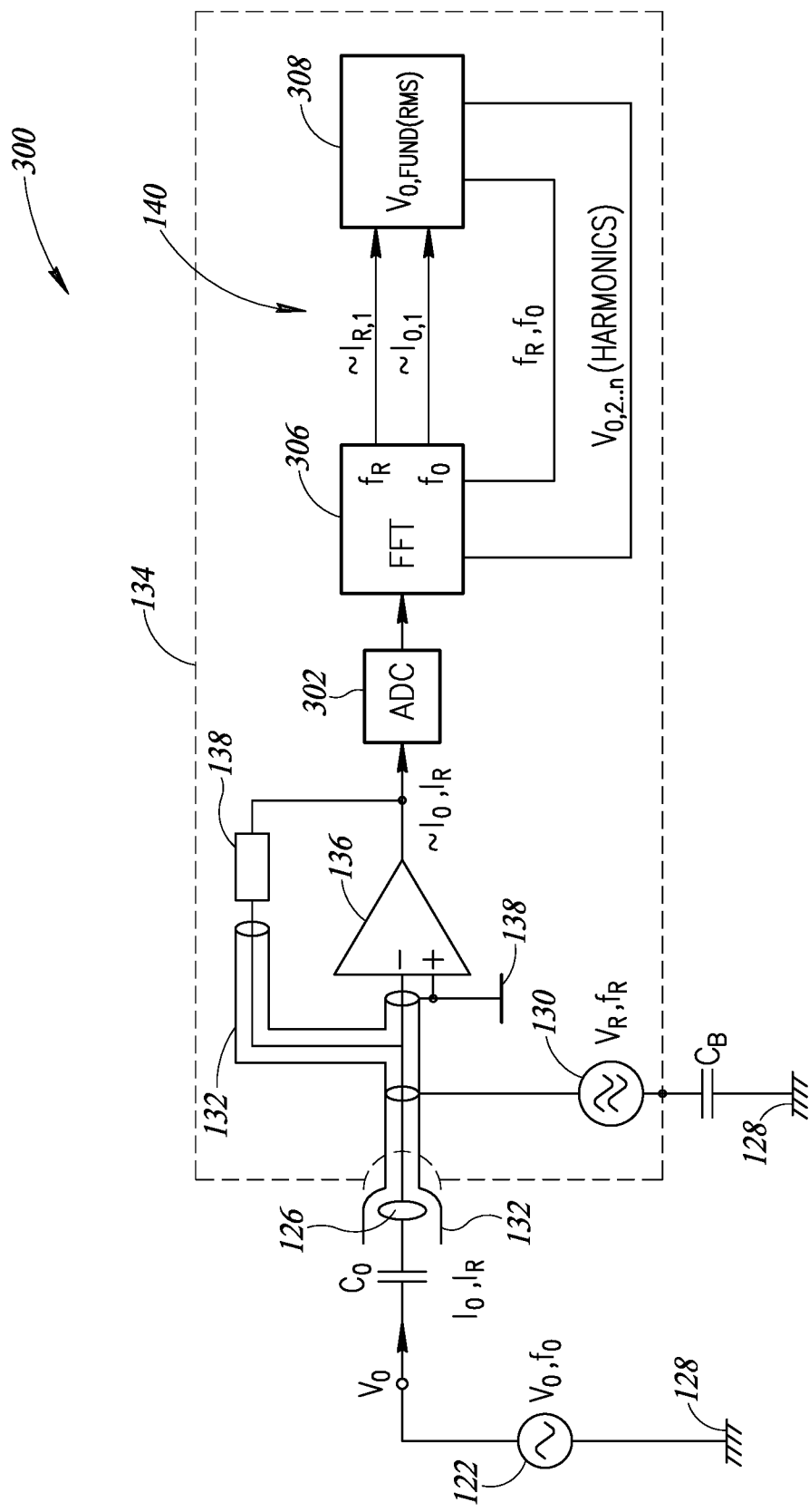
FIG. 4 is a schematic diagram of a non-contact voltage measurement device which implements a fast Fourier transform (FFT), according to one illustrated implementation.

FIG. 3 is a block diagram of a non-contact voltage measurement device 300 which shows various signal processing components of the non-contact voltage measurement device. FIG. 4 is a more detailed diagram of the non-contact voltage measurement device 300 of FIG. 3.

The non-contact voltage measurement device 300 may be similar or identical to the non-contact voltage measurement device 102 discussed above. Accordingly, similar or identical components are labeled with the same reference numerals. As shown, the input amplifier 136 converts the input current ($I_O+I_R$) from the conductive sensor 126 into a sensor current voltage signal which is indicative of the input current. The sensor current voltage signal is converted into digital form using an analog-to-digital converter (ADC) 302.

The AC voltage ($V_O$) in the wire 122 is related to the AC reference voltage ($V_R$) by Equation (1):

$$\frac{V_O}{V_R} = \frac{I_O \times f_R}{I_R \times f_O} \qquad (1)$$

where ($I_O$) is the signal current through the conductive sensor 126 due to the AC voltage ($V_O$) in the conductor 122, ($I_R$) is the reference current through the conductive sensor 126 due to the AC reference voltage ($V_R$), ($f_O$) is the frequency of the AC voltage ($V_O$) that is being measured, and ($f_R$) is the frequency of the reference AC voltage ($V_R$).

The signals with indices "O," which are related to the AC voltage ($V_O$), have different characteristics like frequencies than the signals with indices "R," which are related to the common mode reference voltage source 130. In the implementation of FIG. 4, digital processing, such as circuitry implementing a fast Fourier transform (FFT) algorithm 306, may be used to separate signal magnitudes with different frequencies. In other implementations, analog electronic filters may also be used to separate "O" signal characteristics (e.g., magnitude, frequency) from "R" signal characteristics.

The currents ($I_O$) and ($I_R$) are dependent on the frequencies ($f_O$) and ($f_R$), respectively, due to the coupling capacitor ($C_O$). The currents flowing through the coupling capacitor ($C_O$) and the body capacitance ($C_B$) are proportional to the frequency and thus, the frequency ($f_O$) of the AC voltage ($V_O$) in the conductor 122 under test needs either to be measured to determine the ratio of the reference frequency ($f_R$) to the signal frequency ($f_O$), which is utilized in Equation (1) listed above or the reference frequency is already known because it is generated by the system itself.

After the input current ($I_O+I_R$) has been conditioned by the input amplifier 136 and digitized by the ADC 302, the frequency components of the digital sensor current voltage signal may be determined by representing the signal in the frequency domain using the FFT 306. When both of the frequencies ($f_O$) and ($f_R$) have been measured, frequency bins may be determined to calculate the fundamental magnitudes of the currents ($I_O$) and ($I_R$) from the FFT 306.

The magnitude of the current ($I_R$) and/or the current ($I_O$) may vary as a function of distance between the reference signal sensor or electrode (e.g., electrode 126) and the conductor 122 of the insulated wire 106. Thus, the system may compare the measured current ($I_R$) and/or the current ($I_O$) to expected respective currents to determine the distance between the reference signal sensor or electrode and the conductor 122.

Next, as indicated by a block 308 of FIG. 3, the ratio of the fundamental harmonics of the currents ($I_R$) and ($I_O$), designated $I_{R,1}$ and $I_{O,1}$, respectively may be corrected by the determined frequencies ($f_O$) and ($f_R$), and this factor may be used to calculate the measured original fundamental or RMS voltage by adding harmonics ($V_O$) in the wire 122, which is done by calculating the square root of the squared harmonics sum, and which may be presented to the user on a display 312.

The coupling capacitor ($C_O$) may generally have a capacitance value in the range of approximately 0.02 pF to 1 pF, for example, depending on the distance between the insulated conductor 106 and the conductive sensor 126, as well as the particular shape and dimensions of the sensor 126. The body capacitance ($C_B$) may have a capacitance value of approximately 20 pF to 200 pF, for example.

From Equation (1) above, it can be seen that the AC reference voltage ($V_R$) generated by the common mode reference voltage source 130 does not need to be in the same range as the AC voltage ($V_O$) in the conductor 122 to achieve similar current magnitudes for the signal current ($I_O$) and the reference current ($I_R$). The AC reference voltage ($V_R$) may be relatively low (e.g., less than 5 V) by selecting the reference frequency ($f_R$) to be relatively high. As an example, the reference frequency ($f_R$) may be selected to be 3 kHz, which is 50 times higher than a typical 120 VRMS AC voltage ($V_O$) having a signal frequency ($f_O$) of 60 Hz. In such case, the AC reference voltage ($V_R$) may be selected to be only 2.4 V (i.e., 120 V÷50) to generate the same reference current ($I_R$) as the signal current ($I_O$). In general, setting the reference frequency ($f_R$) to be N times the signal frequency ($f_O$) allows the AC reference voltage ($V_R$) to have a value that is (1/N) times the AC voltage ($V_O$) in the wire 122 to produce currents ($I_R$) and ($I_O$) that are in the same range as each other to achieve a similar uncertainty for $I_R$ and $I_O$.

Any suitable signal generator may be used to generate the AC reference voltage ($V_R$) having the reference frequency ($f_R$). In the example illustrated in FIG. 3, a Sigma-Delta digital-to-analog converter (Σ-Δ DAC) 310 is used. The Σ-Δ DAC 310 uses a bit stream to create a waveform (e.g., sinusoidal waveform) signal with the defined reference frequency ($f_R$) and AC reference voltage ($V_R$). In at least some implementations, the Σ-Δ DAC 310 may generate a waveform that is in phase with the window of the FFT 306 to reduce jitter. Any other reference voltage generator can be used, such as a PWM which may use less computing power than a Σ-Δ DAC.

In at least some implementations, the ADC 302 may have 14 bits of resolution. In operation, the ADC 302 may sample the output from the input amplifier 136 at a sampling frequency of 10.24 kHz for nominal 50 Hz input signals to provide $2^n$ samples (1024) in 100 ms (10 Hz bins for the FFT 306) ready for processing by the FFT 306. For 60 Hz input signals, the sampling frequency may be 12.288 kHz, for example, to get the same number of samples per cycle. The sampling frequency of the ADC 302 may be synchronized to full numbers of cycles of the reference frequency ($f_R$). The input signal frequency may be within a range of 40-70 Hz, for example. Depending on the measured frequency of the AC voltage ($V_O$), the bins for the AC voltage ($V_O$) may be determined using the FFT 306 and use a Hanning window function for further calculations to suppress phase shift jitter caused by incomplete signal cycles captured in the aggregation interval.

In one example, the common mode reference voltage source 130 generates an AC reference voltage ($V_R$) which has a reference frequency ($f_R$) of 2419 Hz. This frequency is in between the 40$^{th}$ harmonic and the 41$^{st}$ harmonic for 60 Hz signals, and between the 48$^{th}$ harmonic and 49$^{th}$ harmonic for 50 Hz signals. By providing an AC reference voltage ($V_R$) which has a reference frequency ($f_R$) that is not a harmonic of the expected AC voltage ($V_O$), the AC voltage ($V_O$) is less likely to influence measurement of the reference current ($I_R$).

In at least some implementations, the reference frequency ($f_R$) of the common mode reference voltage source 130 is selected to be a frequency that is least likely to be affected by harmonics of an AC voltage ($V_O$) in the conductor 122 under test. As an example, the common mode reference voltage source 130 may be switched off when the reference current ($I_R$) exceeds a limit, which may indicate that the conductive sensor 126 is approaching the conductor 122 under test. A measurement (e.g., 100 ms measurement) may be taken with the common mode reference voltage source 130 switched off to detect signal harmonics at a number (e.g., three, five) of candidate reference frequencies. Then, the magnitude of the signal harmonics in the AC voltage ($V_O$) may be determined at the number of candidate reference frequencies to identify which candidate reference frequency is likely to be least affected by the signal harmonics of the AC voltage ($V_O$). The reference frequency ($f_R$) may then be set to the identified candidate reference frequency. This switching of the reference frequency may avoid or reduce the impact of possible reference frequency components in the signal spectrum, which may increase the measured reference signal and reduce accuracy, and may create unstable results. Other frequencies besides 2419 Hz that have the same characteristics include 2344 Hz and 2679 Hz, for example.

As discussed above, the position of the conductor under test may be important to provide good capacitive coupling between the sensor and the conductor under test. In some implementations, the mechanical enclosure of a voltage measurement device may be designed to limit the position of the conductor under test to ensure the conductor is positioned proximate the sensor.

In one or more implementations discussed below with reference to FIGS. 5-7, an array of multiple sensors or sensor elements may be used, wherein the sensors are polled or scanned to determine which of the sensors in the array of sensors has the greatest signal strength, and that sensor is used to obtain measurements, as discussed above. In at least some implementations, all of the other "unselected" sensors may be connected to the guard to provide additional shielding for the one active sensor in the array used for a particular measurement. Thus, in such implementations, the mechanical positioning of the sensor relative to the conductor under test is done "electronically," by selecting the one of a plurality of spaced apart sensors that is closest to the conductor under test.

In at least some implementations, the signal strengths from a plurality of sensors may be used to determine various information about a conductor under test, such as physical characteristics of the conductor including the physical size (e.g., diameter) of the conductor, the physical position of the conductor relative to the measurement device, etc.

Figure 5:
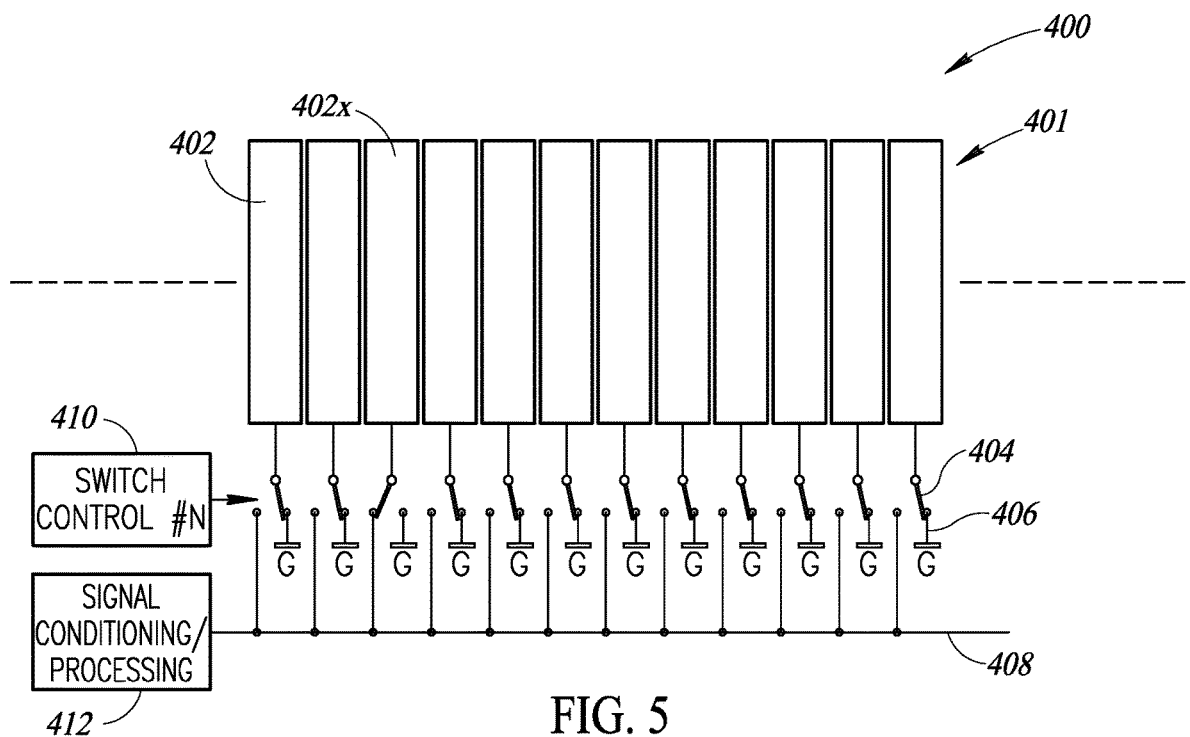
FIG. 5 is a schematic diagram of a sensor subsystem for a non-contact voltage measurement device, wherein the sensor subsystem includes a plurality of sensor elements that are polled in operation, according to one illustrated implementation.

FIG. 5 is a schematic diagram of a sensor subsystem 400 that includes an array 401 of sensors or sensor elements 402. The array 401 of sensors 402 may be positioned and operated similar to the sensor 126 shown in FIGS. 1B and 2, discussed above. The array 401 of sensors 402 may be planar in shape (as shown) or may be non-planar (e.g., U-shaped, V-shaped), as shown in FIG. 6 and discussed below. In at least some implementations, each of the plurality of sensors 402 is elongated in a rectangular shape, as shown in the example of FIG. 5, although other shapes may be used.

Each of the plurality of sensor elements 402 is coupled to a respective controllable switch 404 that is controlled by a switch controller 410 (e.g., processor, control circuitry) coupled to the switches. The switch controller 410 is operative to control the switches 404 to selectively couple each of the sensor elements 402 to either an input node 408 that is fed to an input of signal conditioning or processing circuitry 412, or to a conductive guard node 406 that is electrically coupled to an internal ground guard (e.g., guard 132 discussed above). The signal conditioning or processing circuitry 412 may include one or more of an ADC, filtering circuitry, amplification circuitry, etc.

In at least some implementations, the individual sensor currents from each of the sensors 402 in the sensor array 401 may be tested prior to a measurement to identify the sensor that produces the maximum reference current $I_R$, and only this identified sensor is used for the measurement. This feature may be described as electronically locating the one (or more) sensor 402 that is the closest to the wire under test using a polling or scanning process, and then using that sensor for the measurement. As noted above, in at least some implementations, the remaining unused sensors may be coupled via the switches 404 to the guard node 406, so the other sensors act as a guard during the measurement. In the illustrated example shown in FIG. 5, a sensor 402x is coupled to the signal conditioning or processing circuitry 412 and the other sensors 402 in the sensor array 401 are coupled to the guard node 406 (e.g., ground). The measurement itself may operate similarly or identically to the above-described one sensor arrangement.

In other implementations, the measurement may use up to all of the sensors 402 in parallel, wherein each of the sensors 402 in the sensor array 401 has a separate connection to the signal processing electronics (e.g., ADC, etc.), instead of the sensors 402 being multiplexed and only one sensor of the sensor array 400 active at one moment in time. In such implementations, a combination (e.g., a linearly weighted combination, an exponentially weighted combination, an unweighted combination) of one or more sensor currents may be used for the measurement to provide good drive of the ADC input range and to increase sensitivity with the number of sensors used and therefore to increase the total dynamic measurement range. For example, one or more controllable switches may be operative to selectively electrically couple various combinations of the sensor elements to the signal conditioning circuitry. The various combinations of the sensor elements may include a plurality (e.g., two, four, ten) of adjacent sensor elements. The combinations of the sensor elements may additionally or alternatively at least one of a single sensor element, a plurality of adjacent sensor elements, a plurality of sensor elements, at least two of which are non-adjacent, or all of the sensor elements.

Figure 6:
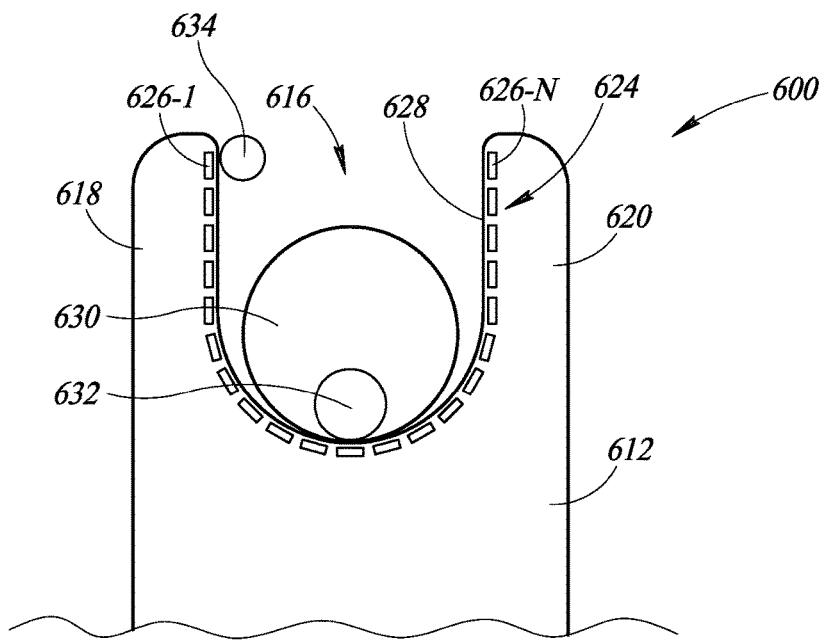
FIG. 6 is a pictorial diagram of a front end of a non-contact voltage measurement device that includes a sensor subsystem similar or identical to the sensor subsystem shown in FIG. 5, according to one non-limiting illustrated implementation.

FIG. 6 is a pictorial diagram of a front end or probe portion 612 of a non-contact voltage measurement device 600 that includes a sensor subsystem 624 similar or identical to the sensor subsystem 400 shown in FIG. 5. The probe portion 612 may include a recessed portion 616 defined by first and second extended portions 618 and 620. The recessed portion 616 receives an insulated wire therein. In the example shown, three insulated wires 630, 632, and 634 are shown in the recessed portion 616 for explanatory purposes. Each of the insulated wires 630, 632, and 634 may include a conductor and an insulator surrounding the conductor, as discussed above. The recessed portion 116 may include a sensor array 626 that includes a plurality of sensor elements 626-1 to 626-N disposed proximate a U-shaped wall 628 of the probe portion 612 of the non-contact measurement device 600 formed by the first extended portion 618 and the second extended portion 620. The sensor array 624 may be disposed inside of the housing of the non-contact voltage measurement device 600 to prevent physical and electrical contact between the sensors 626 and the conductor under test or other objects. In operation, switches may be used to selectively couple each of the sensor elements 626 to signal conditioning circuitry (e.g., ADC) to obtain measurements, as discussed above.

Figure 7:
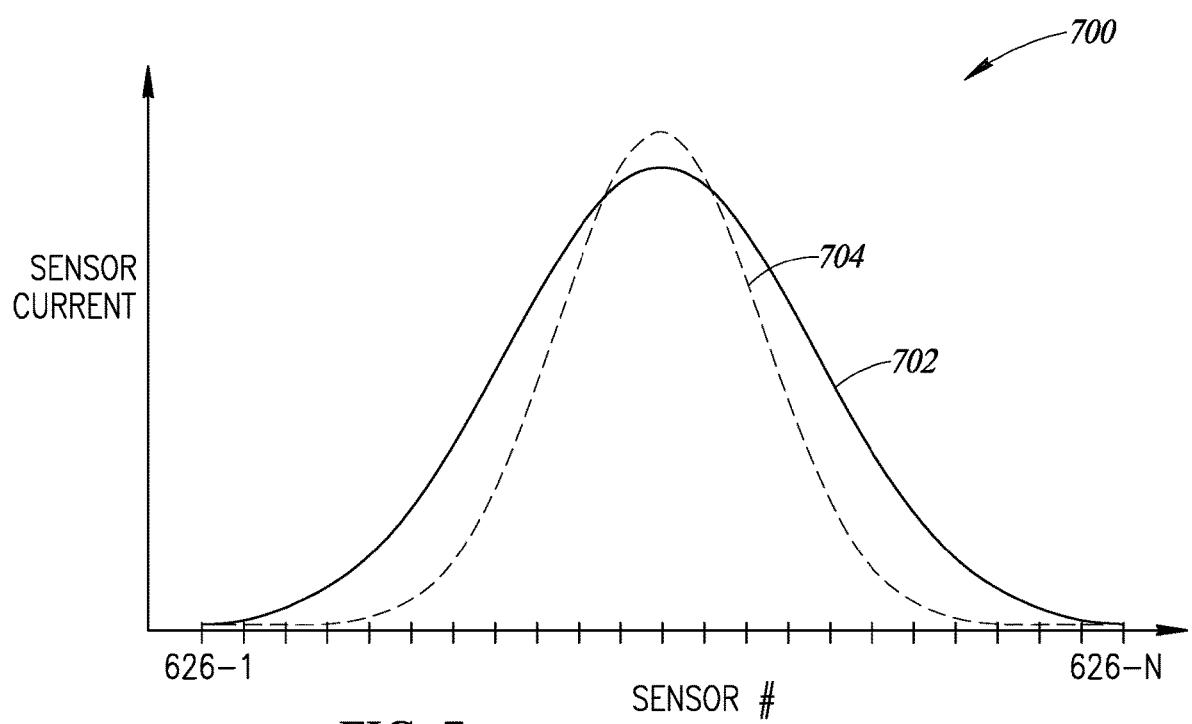
FIG. 7 is a graph that illustrates sensor current for each of a plurality of sensors of a sensor subsystem, showing curves for a relatively small conductor under test and a relatively large conductor under test.

FIG. 7 is a graph 700 that illustrates measured sensor current for each of the plurality of sensors 626-1 to 626-N of the sensor subsystem 624 of FIG. 6. The graph 700 shows a sensor current curve 702 for the larger conductor under test 630 (FIG. 6) and a sensor current curve 704 for the smaller conductor under test 632. As shown, the width of the curve 702 for the relatively large conductor 630 is larger than the width of the curve 704 for the relatively small conductor 632, since the larger conductor 630 is closer to a larger number of the sensors 626 relative to the smaller conductor 632. Thus, the distribution or particular shape of the sensor current curves 702 and 704 for the plurality of sensors 626 for conductors under test may be used to determine the size of the conductors. Such size information may be used in a measurement calculation to provide more accurate measurements, e.g., based on determined or obtained calibration data. As another example, the conductor size information may be stored, transmitted, and/or provided to a user (e.g., via a user interface) for any desired purpose.

Additionally or alternatively, the distribution and/or shape of the sensor currents measured by the sensors 626 may be used to determine the position of the conductor under test. For example, the conductor 634 shown in FIG. 6 may be disposed proximate an upper end of the left extend portion 618 (as shown) inside the recessed portion 616. In such configuration, the sensor current for the sensor 626-1 (adjacent the conductor 634) will be larger than the sensor currents for the sensors that are distant from the conductor 634, such as sensor 626-N. Thus, in at least some implementations, the device may analyze the magnitudes of the sensor currents measured by the sensors 626 to determine the position of the conductor under test. The position information may be used, for example, in a measurement calculation to provide more accurate measurements, e.g., based on determined or obtained calibration data. As another example, the position information may be used to provide visual or audible feedback to a user to guide the user to move the position of the conductor to a better position to obtain more accurate measurements. The position information may also be stored, transmitted, and/or provided to a user (e.g., via a user interface) for any desired purpose.

In at least some implementations of the voltage measurement devices discussed herein, the reference voltage ($V_R$) may have multiple frequencies to reduce signal harmonics or interharmonic influence on the measured reference current ($I_R$) caused by higher frequency components of the signal voltage ($V_O$). For example, the reference voltage source (e.g., source 130 of FIG. 2) may be periodically switched off and the FFT frequency bins around the multiple reference frequencies may be analyzed and checked against a relative limit. The lowest value may be used to define a selected reference frequency ($f_R$) that is least disturbed by the signal voltage ($V_O$) or other influencing factors.

In at least some implementations, the switching off of the reference voltage source may not necessarily generate a gap in the measurement stream. For example, the signal current ($I_O$) may still be measured when the reference voltage source is switched off, and a reference current ($I_R$) measured during the previous interval may be used to estimate the reference current for the interval in which the reference voltage source is switched off.

In addition to the reference frequency switching discussed above, other dedicated signal characteristics of the reference signal may be used. Examples include amplitude or frequency modulation, synchronous or pseudo-stochastic switching, quadrature modulation, phase switching, etc.

As an example of using a modulated signal, the reference signal may be modulated with a modulation frequency $f_m$. In at least some implementations, the modulation frequency $f_m$ may be selected to lie exactly at an integer number of FFT bins. For example, for a 100 ms FFT interval, such frequencies would be frequencies of 10 Hz, 20 Hz, 30 Hz, etc. In the absence of noise at the carrier or reference frequency ($f_R$), this results in two symmetrical side bands, one on each side of the reference frequency.

If both of the two side bands do not have the same magnitude, it can be determined that the reference signal is disturbed (e.g., by the signal voltage ($V_O$)). This is a relatively simple identification process that does not require switching the reference voltage source off. If the reference signal is found to be disturbed, the system may shift the reference frequency by an amount $\Delta f$ and again check the side bands for symmetry until a suitable (undisturbed) reference frequency is identified.

To further speed up the process, in at least some implementations, multiple reference frequencies may be used at the same time. This frequency mixture can be created either by predetermined tables and bit streaming (e.g., $\Sigma\Delta$ DAC bit streaming), or by analog addition of low pass filtered outputs of pulse width modulators (PWM), for example. If PWMs are used, a pair of PWMs may provide a reference frequency and a modulation frequency, and multiple pairs of PWMs may be used to provide multiple reference frequencies and multiple corresponding modulation frequencies.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. Aspects of the implementations can be modified, if necessary, to employ systems, circuits and concepts of the various patents, applications and publications to provide yet further implementations.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A device to measure alternating current (AC) in an insulated conductor, the device comprising:
a housing;
a sensor subsystem physically coupled to the housing, the sensor subsystem selectively positionable proximate the insulated conductor without galvanically contacting the conductor, wherein the sensor subsystem capacitively couples with the insulated conductor, the sensor subsystem comprising a plurality of sensor elements;
a conductive internal ground guard which at least partially surrounds the sensor subsystem and is galvanically isolated from the sensor subsystem, the internal ground guard sized and dimensioned to shield the sensor subsystem from stray currents;
a conductive reference shield which surrounds at least a portion of the housing and is galvanically insulated from the internal ground guard, the conductive reference shield sized and dimensioned to reduce currents between the internal ground guard and an external ground;
a common mode reference voltage source which, in operation, generates an alternating current (AC) reference voltage having a reference frequency, the common mode reference voltage source electrically coupled between the internal ground guard and the conductive reference shield;
signal conditioning circuitry that, in operation, generates a sensor current signal indicative of current conducted through the sensor subsystem;
a plurality of controllable switches, each of the plurality of switches being operative to selectively electrically couple a respective one of the sensor elements to the signal conditioning circuitry; and
control circuitry communicatively coupled to the plurality of switches and the signal conditioning circuitry, wherein, in operation, the control circuitry:
controls the plurality of controllable switches to cause one of the sensor elements to be electrically coupled to the signal conditioning circuitry;
receives a sensor current signal from the signal conditioning circuitry; and
determines the AC voltage in the insulated conductor based at least in part on the received sensor current signal, the AC reference voltage, and the reference frequency.

2. The device of claim 1 wherein each of the plurality of controllable switches is controllable into a first state and a second state, wherein in the first state, the switch electrically couples a respective one of the sensor elements to the signal conditioning circuitry, and in the second state, the switch electrically couples a respective one of the sensor elements to the internal ground guard.

3. The device of claim 1, wherein, in operation, the control circuitry:
for each of the plurality of sensor elements:
controls the controllable switch that is electrically coupled to the sensor element to couple the sensor element to the signal conditioning circuitry;
controls the remaining controllable switches to electrically decouple the remaining sensor elements from the signal conditioning circuitry; and
receives a sensor current signal for the sensor element from the signal conditioning circuitry; and
determines which one of the plurality of sensor elements generates a sensor current signal that has the largest magnitude,
wherein to control the plurality of controllable switches to cause one of the sensor elements to be electrically coupled to the signal conditioning circuitry, the control circuitry controls the plurality of controllable switches to cause the sensor element determined to generate a sensor current signal that has the largest magnitude to be electrically coupled to the signal conditioning circuitry.

4. The device of claim 1, wherein, in operation, the control circuitry:
for each of the plurality of sensor elements:
controls the controllable switch that is electrically coupled to the sensor element to couple the sensor element to the signal conditioning circuitry;
controls the remaining controllable switches to electrically decouple the remaining sensor elements from the signal conditioning circuitry; and
receives a sensor current signal for the sensor element from the signal conditioning circuitry; and
determines a physical characteristic of the conductor under test based at least in part on the received sensor current signals for each of the sensor elements.

5. The device of claim 4, wherein the physical characteristic comprises at least one of: a physical dimension of the conductor under test, or a physical position of the conductor under test.

6. The device of claim 4, wherein, in operation, the control circuitry determines a physical characteristic of the conductor under test via analysis of a distribution of the received sensor current signals for each of the sensor elements.

7. The device of claim 1 wherein the signal conditioning circuitry comprises at least one of an amplifier, a filter, or an analog-to-digital converter.

8. The device of claim 1 wherein the sensor subsystem and the internal ground guard are each non-planar in shape.

9. The device of claim 1, wherein, in operation, the control circuitry:
converts the received sensor current signal to a digital signal; and
processes the digital signal to obtain a frequency domain representation of the sensor current signal.

10. The device of claim 9, wherein the control circuitry implements a fast Fourier transform (FFT) to obtain the frequency domain representation of the sensor current signal.

11. The device of claim 10, wherein the common mode reference voltage source generates the AC reference voltage in phase with a window of the FFT implemented by the control circuitry.

12. The device of claim 1, wherein the control circuitry processes the sensor current signal to determine an insulated conductor current component and a reference current component, the insulated conductor current component indicative of the current conducted through the sensor element due to the voltage in the insulated conductor, and the reference current component indicative of the current conducted through the sensor element due to the voltage of the common mode reference voltage source.

13. The device of claim 12, wherein the control circuitry determines the frequency of the determined insulated conductor current component of the sensor current signal.

14. The device of claim 13, wherein the control circuitry determines the AC voltage in the insulated conductor based on the insulated conductor current component, the reference current component, the frequency of the insulated conductor current component, the reference frequency and the AC reference voltage.

15. A method of operating a device to measure alternating current (AC) voltage in an insulated conductor, the device comprising a housing, a sensor subsystem physically coupled to the housing, the sensor subsystem selectively positionable proximate the insulated conductor without galvanically contacting the conductor, wherein the sensor subsystem capacitively couples with the insulated conductor, the sensor subsystem comprising a plurality of sensor elements, a conductive internal ground guard which at least partially surrounds the sensor subsystem and is galvanically isolated from the sensor subsystem, the internal ground guard sized and dimensioned to shield the sensor subsystem from stray currents, and a conductive reference shield which surrounds at least a portion of the housing and is galvanically insulated from the internal ground guard, the conductive reference shield sized and dimensioned to reduce currents between the internal ground guard and an external ground, the method comprising:
causing a common mode reference voltage source to generate an alternating current (AC) reference voltage having a reference frequency, the common mode reference voltage source electrically coupled between the internal ground guard and the conductive reference shield;
controlling a plurality of controllable switches to cause one of the sensor elements to be electrically coupled to signal conditioning circuitry;
receiving a sensor current signal from the signal conditioning circuitry; and
determining the AC voltage in the insulated conductor based at least in part on the received sensor current signal, the AC reference voltage, and the reference frequency.

16. The method of claim 15, further comprising:
for each of the plurality of sensor elements:
controlling the controllable switch that is electrically coupled to the sensor element to couple the sensor element to the signal conditioning circuitry;
controlling the remaining controllable switches to electrically decouple the remaining sensor elements from the signal conditioning circuitry; and
receiving a sensor current signal for the sensor element from the signal conditioning circuitry; and
determining which one of the plurality of sensor elements generates a sensor current signal that has the largest magnitude, wherein controlling the plurality of controllable switches to cause one of the sensor elements to be electrically coupled to the signal conditioning circuitry comprises controlling the plurality of controllable switches to cause the sensor element determined to generate a sensor current signal that has the largest magnitude to be electrically coupled to the signal conditioning circuitry.

17. The method of claim 15, further comprising:
for each of the plurality of sensor elements:
controlling the controllable switch that is electrically coupled to the sensor element to couple the sensor element to the signal conditioning circuitry;
controlling the remaining controllable switches to electrically decouple the remaining sensor elements from the signal conditioning circuitry; and
receiving a sensor current signal for the sensor element from the signal conditioning circuitry; and
determining a physical characteristic of the conductor under test based at least in part on the received sensor current signals for each of the sensor elements.

18. The method of claim 17, wherein determining a physical characteristic comprises determining at least one of: a physical dimension of the insulated conductor, or a physical position of the insulated conductor.

19. The method of claim 17, wherein determining a physical characteristic of the insulated conductor comprises analyzing a distribution of the received sensor current signals for each of the sensor elements.

20. A device to measure alternating current (AC) in an insulated conductor, the device comprising:
a sensor subsystem selectively positionable proximate the insulated conductor without galvanically contacting the conductor, wherein the sensor subsystem capacitively couples with the insulated conductor, the sensor subsystem comprising a plurality of sensor elements;
signal conditioning circuitry that, in operation, generates a sensor current signal indicative of current conducted through the sensor subsystem; and
a plurality of controllable switches, each of the plurality of switches being operative to selectively electrically couple a respective one of the sensor elements to the signal conditioning circuitry.

21. The device of claim 20, further comprising:
control circuitry communicatively coupled to the signal conditioning circuitry and the controllable switches, wherein, in operation, the control circuitry:
controls the plurality of controllable switches to cause one of the sensor elements to be electrically coupled to the signal conditioning circuitry;
receives a sensor current signal from the signal conditioning circuitry; and
determines an AC voltage in the insulated conductor based at least in part on the received sensor current signal.

22. The device of claim 21, wherein each of the plurality of controllable switches is controllable into a first state and a second state, wherein in the first state, the switch electrically couples a respective one of the sensor elements to the signal conditioning circuitry, and in the second state, the switch electrically couples a respective one of the sensor elements to the internal ground guard.

23. A device to measure alternating current (AC) in an insulated conductor, the device comprising:
a housing;
a sensor subsystem physically coupled to the housing, the sensor subsystem selectively positionable proximate the insulated conductor without galvanically contacting the conductor, wherein the sensor subsystem capacitively couples with the insulated conductor, the sensor subsystem comprising a plurality of sensor elements;
a conductive internal ground guard which at least partially surrounds the sensor subsystem and is galvanically isolated from the sensor subsystem, the internal ground guard sized and dimensioned to shield the sensor subsystem from stray currents;
a conductive reference shield which surrounds at least a portion of the housing and is galvanically insulated from the internal ground guard, the conductive reference shield sized and dimensioned to reduce currents between the internal ground guard and an external ground;
a common mode reference voltage source which, in operation, generates an alternating current (AC) reference voltage having a reference frequency, the common mode reference voltage source electrically coupled between the internal ground guard and the conductive reference shield;
signal conditioning circuitry that, in operation, generates a sensor current signal indicative of current conducted through the sensor subsystem;
a plurality of controllable switches, the plurality of switches being operative to selectively electrically couple various combinations of the sensor elements to the signal conditioning circuitry; and
control circuitry communicatively coupled to the plurality of switches and the signal conditioning circuitry, wherein, in operation, the control circuitry:
controls the plurality of controllable switches to cause a combination of the sensor elements to be electrically coupled to the signal conditioning circuitry, the combination of sensor elements comprising one or more of the plurality of sensor elements;
receives at least one sensor current signal from the signal conditioning circuitry; and
determines the AC voltage in the insulated conductor based at least in part on the received at least one sensor current signal, the AC reference voltage, and the reference frequency.

24. The device of claim 23 wherein the combination of the sensor elements comprises a plurality of adjacent sensor elements.

25. The device of claim 23 wherein the combination of the sensor elements comprises at least one of: a single sensor element, a plurality of adjacent sensor elements, a plurality of sensor elements, at least two of which are non-adjacent, or all of the sensor elements.

* * * * *